United States Patent [19]
Baker et al.

[11] Patent Number: 5,517,154
[45] Date of Patent: May 14, 1996

[54] SPLIT-PATH LINEAR ISOLATION CIRCUIT APPARATUS AND METHOD

[75] Inventors: Clifford E. Baker, Hillsboro; Michael P. Khaw, Portland, both of Oreg.

[73] Assignee: Tektronix, Inc., Wilsonville, Oreg.

[21] Appl. No.: 372,545

[22] Filed: Jan. 13, 1995

[51] Int. Cl.$^6$ .............................. H03F 3/68; H03F 17/00; G01R 13/20

[52] U.S. Cl. .................. 330/59; 324/121 R; 330/126; 330/308

[58] Field of Search ................ 330/54, 126, 308; 315/387, 389, 390, 395, 396; 324/121 R

[56] References Cited

U.S. PATENT DOCUMENTS

| | | | |
|---|---|---|---|
| 3,525,041 | 8/1970 | Velsink | 324/117 |
| 3,733,514 | 5/1973 | Garuts | 330/126 X |
| 4,482,862 | 11/1984 | Leehey | 324/117 R |
| 4,682,101 | 7/1987 | Cattaneo | 324/117 H |
| 5,121,075 | 6/1992 | Roach | 330/126 |

FOREIGN PATENT DOCUMENTS

| | | | |
|---|---|---|---|
| 137710 | 5/1984 | Japan | 330/126 |

OTHER PUBLICATIONS

Model A6902B Isolation Amplifier Service Manual, Tektronix, Inc., Beaverton, Oregon, 1986, p. A2.

*Primary Examiner*—James B. Mullins
*Attorney, Agent, or Firm*—William K. Bucher; Richard B. Preiss

[57] ABSTRACT

A split-path isolation amplifier (10) employs a transformer (30) in a high path (26) and a single-input, dual-output closed-loop optocoupler (66) in a low path (24) to achieve a flat, wide frequency response without need for frequency compensation adjustments. In a low path frequency region (106), the optocoupler provides all or most of the signal to the output. The isolation amplifier employs a substantially overlapped crossover frequency region (104) in which the high path signal is applied to a primary winding (28) of the transformer, and the low path signal is applied differentially to secondary windings (40, 42) of the transformer. At frequencies below the crossover frequency range, the signal from the optocoupler dominates as the signal coupled from the primary winding rolls off. At frequencies above the crossover frequency range, the signal coupled from the primary winding dominates as the signal from the optocoupler rolls off. At frequencies within the crossover frequency range magnetic flux components generated by the primary and secondary transformer windings co-act to provide a combined output signal having a flat frequency response. The only adjustments are those required to match the gain of the low path to the gain of the high path and to compensate for any offset in the low path.

33 Claims, 4 Drawing Sheets

SPLIT-PATH LINEAR ISOLATION CIRCUIT APPARATUS AND METHOD

TECHNICAL FIELD

This invention relates to electronic measurement devices, and more particularly to a linear split-path (or dual-path) isolation circuit that provides a stable, flat frequency response for making isolated electrical signal voltage measurements over a wide frequency range.

BACKGROUND OF THE INVENTION

It is difficult to make safe and accurate measurements of electrical voltage signals that are elevated at a voltage significantly above a ground potential. Quite often, the signal being measured is a low-level signal riding on a high-level common-mode signal, requiring the measuring device to have a high common-mode rejection ratio. Moreover, extraneous ground currents may add hum and ground loop induced voltages to the measured signal. These problems are particularly troublesome when making wide bandwidth oscilloscope measurements of electrical voltage signals.

The above-described measurement problems frequently force oscilloscope users into employing potentially dangerous measurement techniques, such as "floating" the oscilloscope by defeating its ground reference connection. Typically, the oscilloscope is floated by using an isolation transformer, a 3-to-2 prong power plug adaptor, or by simply cutting off the grounding prong on the oscilloscope power plug. Floating the oscilloscope not only creates a high voltage shock hazard on the oscilloscope, but also unduly stresses its power transformer insulation and reduces measurement accuracy because of capacitance-induced ground current.

Clearly, for safe and accurate measurements, an oscilloscope should be connected to ground. Fortunately there are several safe and accurate floating measurement solutions available including indirect grounding devices, differential measurement devices, isolated input systems, and isolation amplifiers.

Indirect grounding devices are connected between the measuring device and the power main. An exemplary indirect grounding device is the model A6901 Ground Isolation Monitor, manufactured by Tektronix, Inc., Beaverton, Oreg., the assignee of this application. The Ground Isolation Monitor allows the measurement device to float up to a safe signal reference level of about 40 volts and immediately reconnects the measurement device to ground when the signal reference level exceeds 40 volts. Unfortunately, measurements are limited to the 40-volt limit, the entire measurement device is elevated at the reference level, inadvertently grounding the measurement device can short circuit the measured circuit, and a significant capacitance between reference ground and power ground can cause inaccurate measurements.

Differential voltage measurements that do not require floating the measurement device can be made with high accuracy by employing a differential amplifier, such as the model 11A33 manufactured by Tektronix, Inc., Beaverton, Oreg., the assignee of this application. Unfortunately, differential amplifiers are costly and complex, have limited common-mode rejection, require pairs of balanced probes to connect to the signal being measured, and are limited to measuring signal voltages below about 500 volts.

Isolated input systems include battery-powered, hand-held measuring devices that are inherently isolated from the power mains. Such devices are usually well insulated and are capable of measuring small signals elevated by hundreds, or even thousands, of volts. Unfortunately, battery-powered measuring devices typically have limited measurement sensitivity and bandwidth and can present significant capacitance to the circuit being measured.

Isolation amplifiers are typically connected between a circuit being measured and the measuring device. An exemplary isolation amplifier is the model A6902B Voltage Isolation Amplifier, manufactured by Tektronix, Inc., Beaverton, Oreg., the assignee of this application. Isolation amplifiers provide an isolation barrier across which an input signal being measured is coupled. Isolation amplifiers offer a preferred solution to floating measurements because the input signal may be elevated at a voltage of up to about 3,000 volts, the capacitance across the isolation barrier is relatively low, and the measurement bandwidth spans a range from zero Hertz (direct current, or "DC") to about 25 MegaHertz because a split-path isolation technique is employed.

The split-path isolation technique employs separate isolation barrier devices for coupling a DC-to-low-frequency ("low path") component and a low-frequency-to-high-frequency ("high path") component of the input signal. Outputs from the low path and high path are recombined by a summing amplifier to generate a resultant, DC to high-frequency ("wideband") output signal.

The A6902B high path and low path employ respectively a transformer and an optocoupler to couple separate frequency components of the input signal across an isolation barrier to drive the summing amplifier. Linearity of the low path is controlled by a second optocoupler that provides a closed-loop feedback path. Unfortunately, low path linearity depends on the degree to which the thermal and electrical transfer characteristics of the two optocouplers are matched. Linearity of the high path depends on the coupling characteristics of the transformer, which depend to a large degree on the magnetic flux characteristics of it core material. The above-described linearity determining factors co-act such that the A6902B requires 17 adjustments to properly balance its gain, offset, and frequency response.

Measuring electrical signal currents typically requires inserting a current measuring sensor in the current carrying conductor, an operation that is potentially hazardous, alters the frequency response of the conductor, and leads to inaccurate high-frequency measurements. As a result, prior workers have employed Hall-effect devices to sense current flow-induced magnetic flux in the conductor to measure DC-to-medium-frequency signal currents without breaking or electrically contacting the conductor. It follows that a Hall-effect device could be employed in the low path of an isolation amplifier if the signal voltage was first converted to a signal current. An exemplary current sensing Hall-effect circuit is described in U.S. Pat. No. 3,525,041 issued Aug. 18, 1970 for MAGNETIC FIELD MEASURING METHOD AND DEVICE EFFECTIVE OVER A WIDE FREQUENCY RANGE, which is assigned to the assignee of this application. Unfortunately, Hall-effect devices have a current sensitivity that varies with temperature, thereby requiring frequent calibration to maintain measurement accuracy. In addition, Hall-effect devices are not well-suited to employing feedback techniques and, therefore, have relatively poor linearity. The same has been generally true for optocouplers, which are used extensively for coupling and isolating digital signals where signal fidelity is not an important factor. Prior split-path isolation amplifiers also have difficulty maintaining signal accuracy at a crossover frequency region in which the low-path and high-path frequency ranges overlap. It is well known to match the 3-db low path and high path rolloff frequencies to achieve a crossover frequency, which causes a slight "dip" in the amplitude of the combined signal at the crossover frequency. Therefore, conventional split-path amplifiers typically employ a dozen or more variable resistor and capacitor adjustments to correct the combined signal amplitude in the crossover frequency region. The variable resistors and capacitors must be precision components that unfortunately add significant cost to prior isolation amplifiers, reduce their reliability, and require periodic readjustment to maintain signal accuracy.

What is needed, therefore, is a simplified linear split-path isolation amplifier that eliminates frequency compensation adjustments, has broadened signal measurement bandwidth, reduced capacitance across the isolation barrier, and generally lowered cost and improved reliability.

SUMMARY OF THE INVENTION

An object of this invention is, therefore, to provide an improved split-path isolation apparatus and method having an accurate and stable response over a wide range signal measurement frequency range.

Another object of this invention to provide a simplified split-path isolation amplifier that maintains a stable frequency and pulse response without requiring frequency compensation adjustments.

A further object of this invention is to provide a split-path isolation amplifier having minimum amplitude response drift over a wide temperature range.

Still another object of this invention is to provide a linear split-path isolation amplifier in which an output signal accurately represents an input signal irrespective of nonlinearities in the low-path and high-path isolation barrier devices employed.

Yet a further object of this invention is to provide an oscilloscope having a floating input amplifier that reduces the oscilloscope cost while improving its reliability and manufacturability.

Accordingly, a split-path isolation amplifier circuit employs a magnetic flux hulled transformer in the high path and a single-input, multi-output optocoupler to provide closed-loop feedback in the low path to achieve a flat, wide frequency response without need for frequency compensation adjustments. In the low-path frequency region, the optocoupler provides all or most of the signal to the output. The isolation amplifier employs a substantially overlapped crossover frequency region in which the high-path signal is applied to a primary winding of the transformer, and the low-path signal is applied differentially to secondary windings of the transformer. At frequencies below the crossover frequency range, the signal from the optocoupler dominates as the signal coupled from the primary winding rolls off. At frequencies above the crossover frequency range, the signal coupled from the primary winding dominates as the signal from the optocoupler rolls off. At frequencies within the crossover frequency range, magnetic flux components generated by the primary and secondary transformer windings co-act to provide a combined output signal having a flat frequency response. The only adjustments are those required to match the gain of the low path to the high path and to compensate for any offset in the low path.

Additional objects and advantages of this invention will be apparent from the following detailed description of preferred embodiments thereof that proceed with reference to the accompanying drawings.

DETAILED DESCRIPTION OF A PREFERRED EMBODIMENTS

Figure 1:
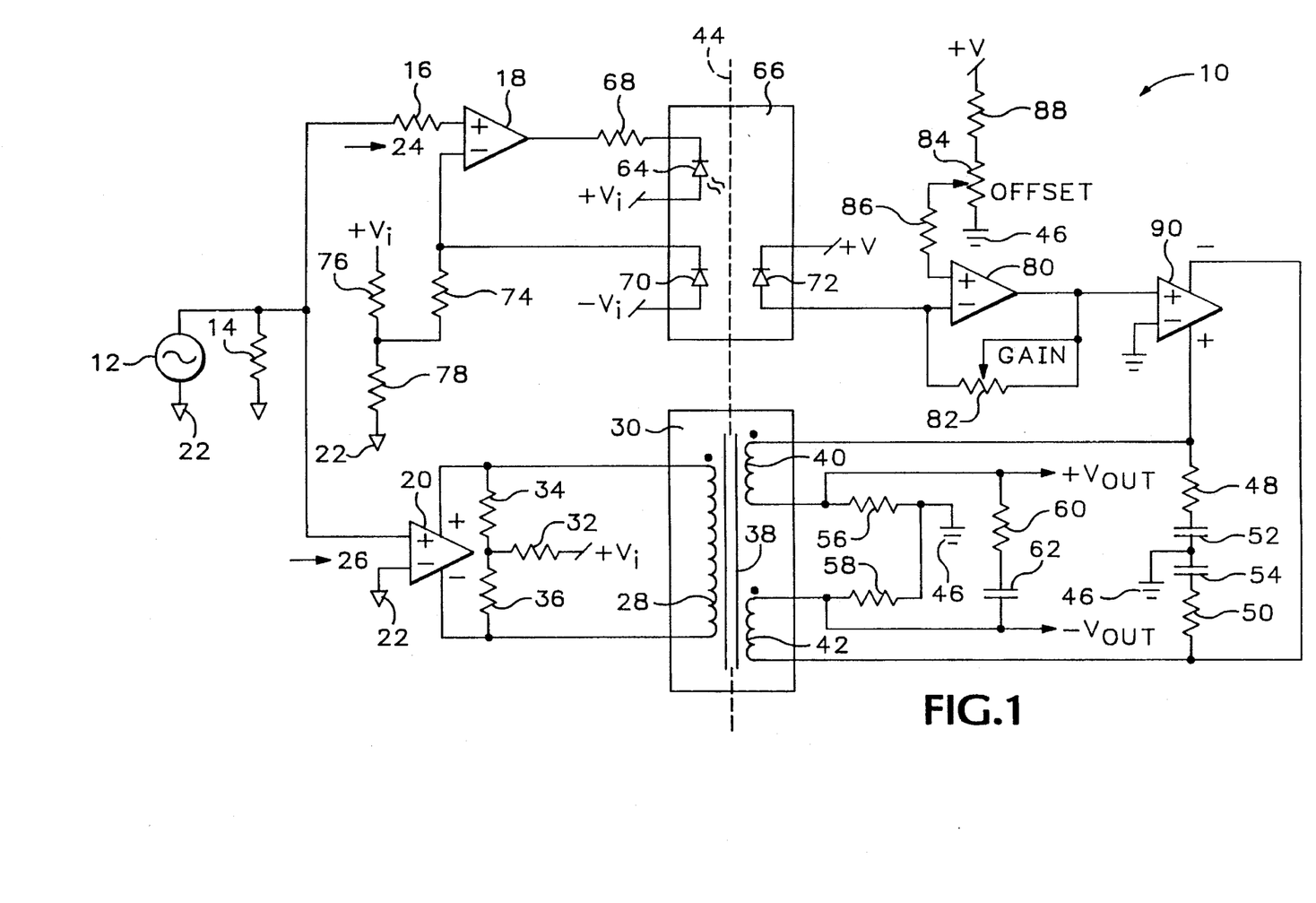
FIG. 1 is a schematic circuit diagram showing a preferred split-path isolation amplifier of this invention.

FIG. 1 shows a split-path isolation amplifier 10 (hereafter "amplifier 10") in which an input signal source 12 is electrically connected to a 50 ohm termination resistor 14 and through a 30,000 ohm resistor 16 to the noninverting input of an operational amplifier 18 (hereafter "amplifier 18"), and to the noninverting input of a transconductance amplifier 20 (hereafter "amplifier 20"). Input signal source 12 is referenced to an isolated ground 22. Amplifier 18 is preferably a type number LN-412 manufactured by National Semiconductor Corporation, Palo Alto, Calif., and amplifier 20 is preferably a type number MAX-435 manufactured by Maxim Integrated Products, Sunnyvale, Calif. Amplifiers 18 and 20 split the signal originating at input signal source 12 into a low path 24 and a high path 26.

Regarding high path 26, input signal source 12 is electrically connected to the noninverting input of amplifier 20, which converts it into a corresponding differential output current that flows through a primary winding 28 of a transformer 30. Transformer 30 is preferably toroidal transformer part number Z-93203J manufactured by ZMANmagnetics, Kent, Wash. The differential outputs of amplifier 20 receive power from an isolated voltage source $+V_i$, through 160 ohm resistor 32 and 75 ohm resistors 34 and 36.

High path 26 signal current flowing through primary winding 28 produces a magnetic flux in a core 38 of transformer 30 that varies with time and induces a corresponding voltage across primary winding 28. The magnetic flux also passes through a pair of secondary windings 40 and 42 and consequently induces associated time-varying currents therein that generate a magnetomotive force in a direction opposing the flux produces by primary winding 28. The time varying current in secondary windings 40 and 42 is effective only in a high-frequency range and effectively nulls the flux produced by primary winding 28.

A first pair of oppositely phased output connections from secondary windings 40 and 42 are high-frequency terminated to a chassis ground 46 by series resistor-capacitor ("RC") networks formed by 20 ohm resistors 48 and 50 and 0.015 MicroFarad capacitors 52 and 54. The second pair of oppositely phased output connections from secondary windings 40 and 42 are wide-band terminated to chassis ground 46 by 20 ohm resistors 56 and 58, across which are developed differential output voltages $+V_{OUT}$ and $-V_{OUT}$ (collectively "$V_{OUT}$"). An optional high-frequency parasitic suppression RC network typically formed by a 330 ohm resistor 60 and a 0.003 MicroFarad capacitor 62 may be connected across the differential outputs depending on the type of amplifier 90 chosen for a particular application.

Figure 2A:
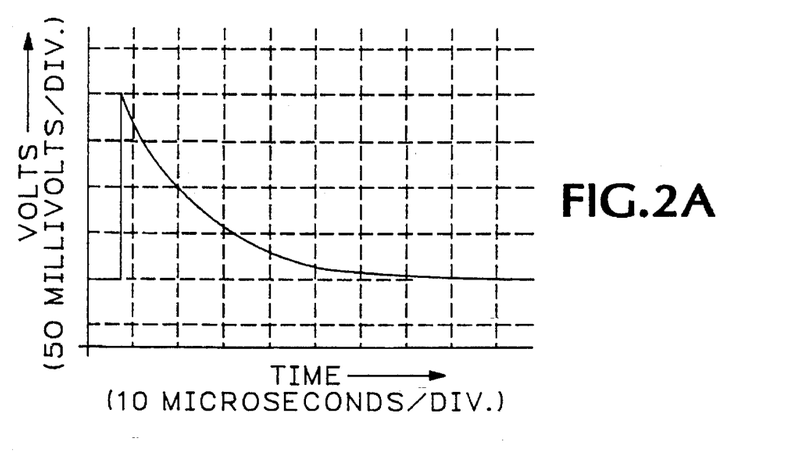
FIGS. 2A, 2B, and 2C are graphs showing the pulse response versus time for the respective high-path, low-path, and split-path amplifiers of FIG. 1.

FIG. 2A shows the amplitude response versus time of high path 26 to a 200 millivolt step input signal. High path 26 follows the input signal rise-time and immediately decays exponentially back to zero volts in a 90 to 10 percent fall-time of about 36.6 Microseconds. The fall-time indicates that high path 26 has a low-frequency 3-db rolloff frequency of about 9.5 KiloHertz.

Referring again to FIG. 1, transformer 30 further forms a first portion of an isolation barrier 44 (shown in dashed lines) that separates the portions of amplifier 10 that are referenced to isolated ground 22 and chassis ground 46. Isolation barrier 44 is formed by an air gap, a vacuum, or some other form of an electrical insulator. Preferred parameters for transformer 30 are described below.

Toroidal core 38 is Magnetics, Inc. part number G-40705-TC that has a 7.62 millimeter (0.300 inch) outside diameter, a 3.18 millimeter (0.125 inch) inside diameter, and a 4.78 millimeter (0.188 inch) height.

Primary winding 28 is 32-AWG silver-plated solid copper wire having 0.25 millimeter (0.010 inch) thick TEFLON insulation.

Secondary windings 40 and 42 are each 12 turns of bifilar wound 32-AWG enameled wire forming a single flat layer on core 38.

A single layer of Minnesota Mining and Manufacturing type number 56 TEFLON tape is wound over the top of secondary windings 40 and 42.

Primary winding 28 is four turns of wire formed in a single flat layer spread over the top of taped secondary windings 40 and 42.

Secondary windings 40 and 42 each have an inductance of about 208 to about 364 MicroHenrys measured at 100 KiloHertz with a 0.1 volts maximum measurement signal.

Transformer 30 has a minimum bandwidth of about 250 MegaHertz.

Transformer 30 is designed to withstand a high-potential breakdown test (primary to secondary) of at least 3,500 RMS volts applied for 10 seconds and a surge voltage withstand test of 4,400 RMS volts for one minute.

Regarding low path 24, in response to the input signal voltage at input signal source 12, amplifier 18 controllably sinks a current that flows from isolated positive voltage source $+V_i$ through a light-emitting diode ("LED") 64 located inside a single-input, dual-output optocoupler 66, which is preferably a type number CNR-201 manufactured by Hewlett-Packard Corporation, Inglewood, Colo. A 245 ohm resistor 68 limits the current flow through LED 64 to a safe value. Optocoupler 66 includes a pair of matched photodiodes 70 and 72 that each sense a substantially equal portion of an optical flux generated by LED 64 in response to the controllably sinked current. Optocoupler 66 further forms a second portion of isolation barrier 44.

In response to the optical flux, photodiode 70 causes a corresponding signal current to flow from an isolated negative voltage source $-V_i$, through a 2,000 ohm resistor 74, and into the junction connecting biasing network resistors 76 and 78. A feedback voltage generated at the junction between photodiode 70 and resistor 74 is electrically connected to the inverting input of amplifier 18 such that a negative feedback loop is formed around amplifier 18. Thereby, amplifier 18 compensates for nonlinearities inherent in devices such as LED 64 and photodiodes 70 and 72, such that matched signal currents flow in photodiodes 70 and 72 that faithfully correspond with the signal voltage at input signal source 12.

Isolated voltage sources $+V_i$ and $-V_i$ each have a preferred potential of about five volts and are conventionally generated by coupling 100 KiloHertz power across isolation barrier 44 with a low-capacitance transformer (not shown). Conventional rectification and regulation is then employed. Alternatively, batteries, photo-voltaic devices, or other isolated, low-capacitance power coupling techniques may be employed.

On the side of isolation barrier 44 referenced to chassis ground 46, signal current flows from a voltage source V under control of photodiode 72 and into an operational amplifier 80, which is preferably a type number LN-412 manufactured by National Semiconductor Corporation, Palo Alto, Calif. The gain of amplifier 80 may be adjustable by a variable resistor 82 that is settable to approximately match the 2,000 ohm resistance of resistor 74, thereby causing approximately equal signal currents to flow through photodiodes 70 and 72. Alternatively, the gain of amplifier 80 may be digitally controlled by employing a digital-to-analog converter to drive a voltage-controlled gain cell.

Likewise, the offset of amplifier 80 may be adjusted by a 250 ohm variable resistor 84, the slider of which is connected through a 2,000 ohm resistor 86 to the noninverting input of amplifier 80. One end of variable resistor 84 is connected to chassis ground 46, and the other end is connected through a 2,200 ohm resistor 88 to voltage source +V. Alternatively, the offset of amplifier 80 may be digitally controlled by employing a digital-to-analog converter to drive the noninverting input of amplifier 80.

The voltage output of amplifier 80 is converted into a differential current by a transconductance amplifier 90, the differential outputs of which drive the high-frequency terminated ends of secondary windings 40 and 42 of transformer 30. Amplifier 90 is preferably a custom integrated circuit amplifier, however any amplifier having characteristics such as those of type number MAX-435 or MAX-436 manufactured by Maxim Integrated Products, Sunnyvale, Calif. are suitable for use in this invention. The noninverting and inverting outputs of amplifier 90 are connected respectively to secondary windings 40 and 42 such that the differential output currents from amplifier 90 flow through secondary windings 40 and 42 and into wideband termination resistors 56 and 58, to generate a low-frequency component of output voltages $V_{OUT}$ that is proportional to the output current. Moreover, the differential output currents from amplifier 90 produce a magnetic flux in core 38 that opposes the flux produced by primary winding 28. Therefore, at low-path frequencies, current in secondary windings 40 and 42 produces magnetic flux that substantially nulls out the flux produced by primary winding 28.

Figure 2B:
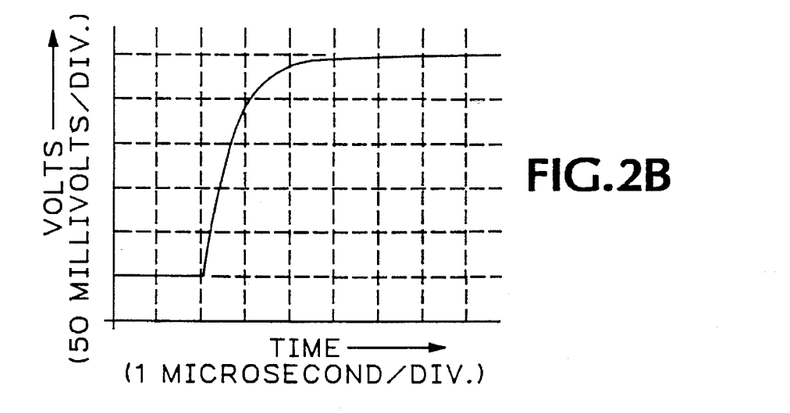

FIG. 2B shows the amplitude response versus time of low path 24 to a 250 millivolt step input signal. Low path 24 rises exponentially to 250 millivolts in a 10 to 90 percent rise-time of about 1.3 Microseconds. The rise-time indicates that low path 24 has a high-frequency 3-db rolloff frequency of about 269 KiloHertz.

Referring again to FIG. 1, the high path 26 signal coupled through transformer 30 becomes a dominant portion of output voltages $V_{OUT}$ as the low path 24 signal applied to secondary windings 40 and 42 starts to roll off. At frequencies where both low path 24 and high path 26 produce significant magnetic flux in core 38, the vector-sum of the magnetic flux components produced by the two paths is close to zero. If one path does not have sufficient drive current, for instance low path 24, the other path produces sufficient current to null the input flux. Low path 24 and high path 26 thus co-act effectively over a crossover frequency region to produce a flat, wideband frequency response for amplifier 10.

Nonlinear magnetic effects are substantially reduced or eliminated because the net magnetic flux in core 38 of transformer 30 is substantially zero over the entire frequency range of amplifier 10. Moreover, time and temperature stability of optocoupler 66 is ensured because matched photodiodes 70 and 72 are employed in a feedback loop to accurately track the optical flux of LED 64. Therefore, this invention complementarily self-compensates for variations between low path 24 and high path 26 to produce output voltages $V_{OUT}$ that accurately represent the input signal voltage at input signal source 12.

Figure 2C:
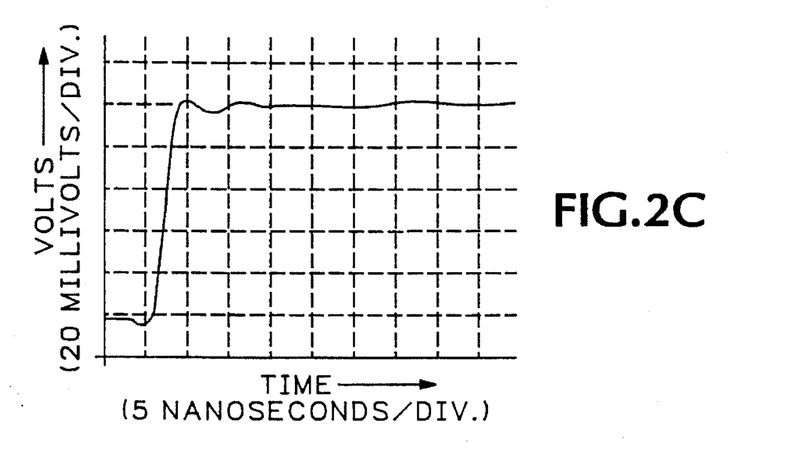

FIG. 2C shows the resulting combined amplitude response versus time of amplifier 10 to a 100 millivolt step input signal. Amplifier 10 rises exponentially to 100 millivolts in a 10 to 90 percent rise-time of about 3.23 Nanoseconds. The rise-time indicates that amplifier 10 has a high-frequency 3-db rolloff frequency of about 108 MegaHertz.

Figure 3:
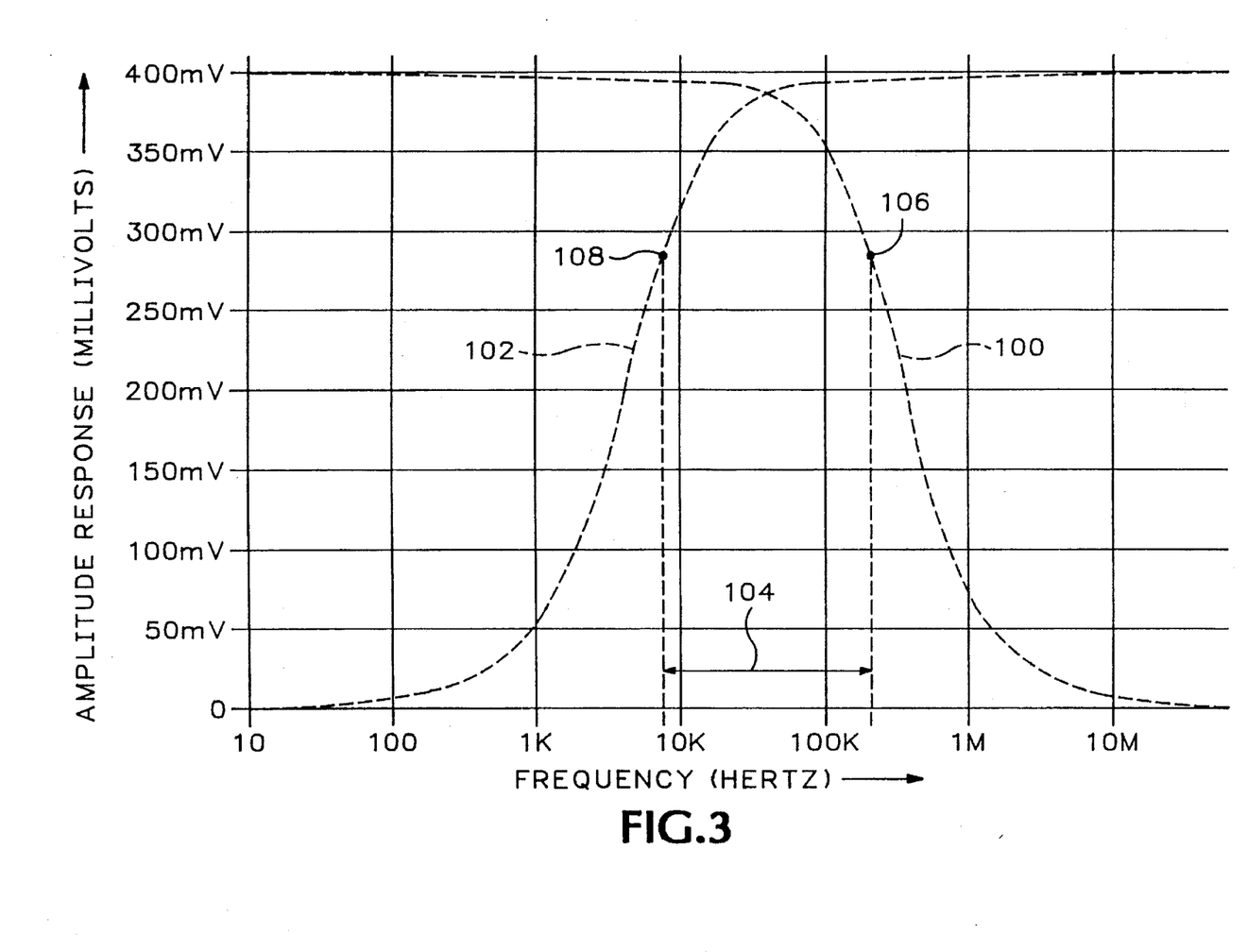
FIG. 3 is a graph of the amplitude response versus frequency for low-path and high-path sections of the amplifier of FIG. 1.

Referring to FIGS. 1 and 3, it is preferred that a low-path amplitude response 100 and a high-path amplitude response 102 substantially overlap in a crossover frequency region indicated by double-ended arrow 104. In particular, low path 24 has a high-frequency 3-db rolloff point 106 at a frequency of about 269 KiloHertz, and high path 26 has a low-frequency 3-db rolloff point 108 at a frequency of about 9.5 KiloHertz.

Transformer 30, optocoupler 66, the power coupling transformer, and other stray capacitance sources combine to produce a total capacitance across isolation barrier 44 of about 50 PicoFarads, a capacitance sufficiently low to minimize extraneous ground currents.

Figure 4:
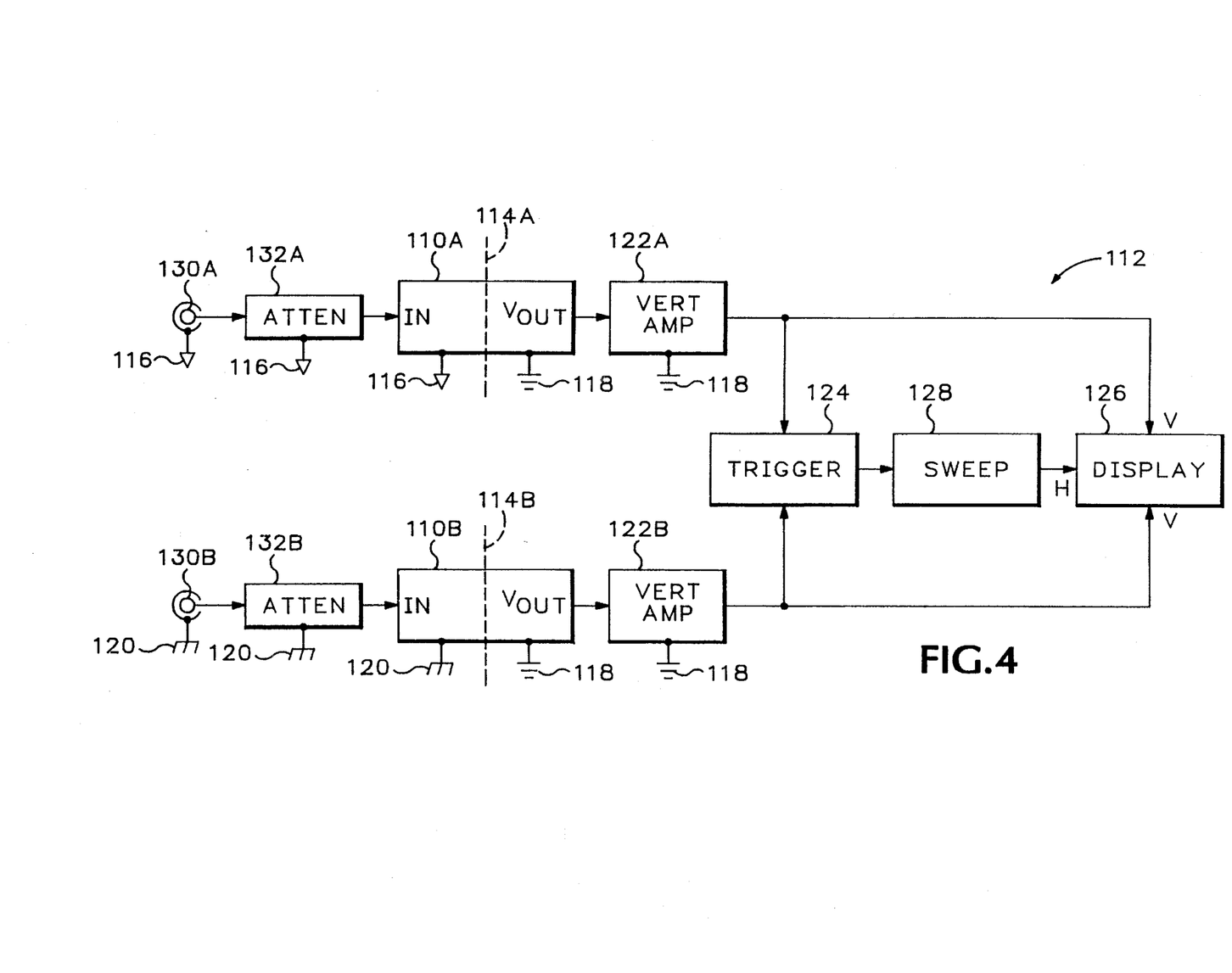
FIG. 4 is a simplified schematic block diagram showing a dual-channel oscilloscope embodiment of a pair of split-path isolation amplifiers of this invention.

FIG. 4 shows a pair of split-path isolation amplifiers 110A and 110B (collectively "amplifiers 110") of this invention embodied in an oscilloscope 112. Amplifier 110A has an isolation barrier 114A (shown in dashed lines) that separates a first isolated ground 116 in amplifier 110A from a chassis ground 118 in oscilloscope 112. Likewise, amplifier 110B has an isolation barrier 114B (shown in dashed lines) that separates a second isolated ground 120 in amplifier 110B from chassis ground 118 in oscilloscope 112. Isolation barriers 114A and 114B are arranged to mutually isolate grounds 116, 118, and 120 from one another. While isolation barriers 114A and 114B may withstand several thousand volts, practical insulation considerations within oscilloscope 112 limit the degree of voltage isolation to about 600 volts.

Output signals $V_{OUT}$ generated by amplifiers 110 are referenced to chassis ground 118 for driving conventional vertical amplifiers 122A and 122B (collectively "vertical amplifiers 122"), which in turn drive a trigger subsystem 124 and a pair of vertical inputs V of a display subsystem 126. Trigger subsystem 124 selects appropriate portions of signals received from vertical amplifiers 122 for triggering a sweep subsystem 128, which responds by generating a sweep signal that drives a horizontal input H of display subsystem 126. Thereby, the output signals generated by amplifiers 110 are graphically displayed in a conventional voltage versus time format by display subsystem 126.

A connector 130A receives a first electrical signal that is referenced to first isolated ground 116 and electrically connects it to an attenuator 132A for signal conditioning and further connection to the isolated input of amplifier 110A. Likewise, a connector 130B receives a second electrical signal that is referenced to second isolated ground 120 and electrically connects it to an attenuator 132B for signal conditioning and further connection to the isolated input of amplifier 110B.

An unexpected benefit of amplifiers 110 is their overall simplicity, linearity, and manufacturability in comparison to conventional wideband amplifiers employed in oscilloscopes. It is, therefore, preferable to employ amplifiers 110 in oscilloscope 112 even though such isolation amplifiers have typically been provided as a standalone accessory. In addition to the primary signal isolation benefit, oscilloscope 112 also benefits from improved maintainability, reliability, signal fidelity, bandwidth, stability, operator safety, and reduced manufacturing cost.

Oscilloscope 112 preferably employs signal conditioners, signal samplers, digitizers, processors, memories, and raster-scanned display technology to implement a conventional dual-channel digital sampling oscilloscope mainframe. Of course, conventional analog oscilloscope technology may also be employed, and either technology may include any number of signal channels. An exemplary oscilloscope mainframe is the model 2465, which is manufactured by the assignee of this application. Moreover, controls associated with amplifiers 110 and attenuators 132 may be "cold switched" by digital signals coupled across isolation barriers 114 by optocouplers, transformers, or the like.

Skilled workers will recognize that portions of this invention may have alternative embodiments. For example, transformer 30 may have a single secondary winding that is driven with a single-ended amplifier.

The above-described preferred embodiment lists preferred component types and values, but, of course, the various amplifier, transformer, optocoupler, and related component types and values may be changed, added, or deleted to suit particular application requirements.

Likewise, a discrete component embodiment of this invention is described, whereas appropriate ones of the various amplifiers, components, and subsystems may be implemented as some combination of integrated circuits, hybrid circuits, or multichip modules.

And, while the preferred embodiment describes matching the gain of low path 24 to high path 26 by manual adjustments associated with amplifier 80, manual or automatic gain and/or offset adjustments may be applied to virtually any combination of the amplifiers in this invention.

It will be obvious to those having skill in the art that many changes may be made to the details of the above-described embodiments of this invention without departing from the underlying principles thereof. Accordingly, it will be appreciated that this invention is also applicable to signal isolation applications other than those found in electronic signal measurement devices. The scope of the present invention should, therefore, be determined only by the following claims.

We claim:

1. A split-path amplifier apparatus for amplifying a wideband input signal voltage to provide a wideband output signal voltage that accurately represents the wideband input signal voltage, comprising:

a high path amplifier that amplifies the wideband input signal voltage and couples a low-frequency to high-frequency portion thereof to a signal combiner;

a low path amplifier that amplifies the wideband input signal voltage and couples a DC to low-frequency portion thereof to the signal combiner; and the signal combiner having a transformer with a primary winding and first and second secondary windings that receives the DC to low-frequency portion and the low-frequency to high-frequency portion of the amplified input signal voltage with the first and second secondary windings co-acting with the primary winding to produce a substantially zero net magnetic flux in the transformer over the DC to high-frequency range of the wideband output signal voltage, the frequency portions being substantially overlapped in a crossover frequency region such that the signal combiner produces the wideband output signal voltage having a substantially flat amplitude response without requiring frequency response adjustments in the crossover frequency region.

2. The apparatus of claim 1 in which the DC to low-frequency portion of the amplified input signal voltage has a 3-db rolloff frequency greater than about 100 KiloHertz and the low-frequency to high-frequency portion of the amplified input signal voltage has a 3-db rolloff frequency less than about 10 KiloHertz.

3. The apparatus of claim 1 further including a gain adjustment for matching an amplitude response of the low path amplifier to an amplitude response of the high path amplifier.

4. The apparatus of claim 1 in which the wideband output signal voltage is an accurate representation of the wideband input signal voltage over an input signal frequency range from about zero Hertz to at least about 25 MegaHertz.

5. The apparatus of claim 1 in which the wideband output signal voltage is an accurate representation of the wideband input signal voltage over an input signal frequency range from about zero Hertz to at least about 100 MegaHertz.

6. The apparatus of claim 1 in which the low path amplifier couples the amplified DC to low-frequency portion of the wideband input signal through a single-input, multi-output optocoupler a first output of which forms a first portion of an isolation barrier, and a second output of which forms a linearity controlling feedback path around the low path amplifier.

7. The apparatus of claim 6 in which the high path amplifier couples the amplified low-frequency to high-frequency portion of the wideband input signal through the transformer that forms a second portion of the isolation barrier.

8. The apparatus of claim 7 in which the first secondary winding on the transformer is electrically connected to a first termination resistor, and in which the DC to low-frequency portion of the wideband output signal voltage is developed across the first termination resistor by a first current that is controlled by the optocoupler, and the low-frequency to high-frequency portion of the wideband output signal voltage is developed across the first termination resistor by a voltage that is generated by the first secondary winding of the transformer.

9. The apparatus of claim 8 in which the second secondary winding on the transformer is electrically connected to a second termination resistor, and in which the DC to low-frequency portion of the wideband output signal voltage is further developed across the second termination resistor by a second current that is controlled by the optocoupler, and the low-frequency to high-frequency portion of the wideband output signal voltage is further developed across the second termination resistor by a voltage that is generated by the second secondary winding of the transformer, the first and second termination resistors cooperating to develop a differential wideband output signal voltage.

10. The apparatus of claim 7 in which the wideband input signal is referenced to a first ground and the wideband output signal is referenced to a second ground that is electrically insulated from the first ground by the isolation barrier.

11. The apparatus of claim 10 in which the isolation barrier has a capacitance of less than about 50 PicoFarads between the first ground and the second ground.

12. The apparatus of claim 10 in which the first ground is elevated at a voltage in a range of about 50 volts to about 4,400 volts relative to the second ground.

13. A split-path isolation apparatus for receiving a wideband input signal voltage referenced to a first ground and accurately amplifying the input signal voltage to provide a wideband output signal voltage referenced to a second ground that is isolated from the first ground by an isolation barrier, comprising:

a high path amplifier that amplifies the wideband input signal voltage and couples a low-frequency to high-frequency portion thereof through a transformer having a primary winding and first and second secondary windings that forms a first portion of the isolation barrier;

a low path amplifier that amplifies the wideband input signal voltage and couples a DC to low-frequency portion thereof through a single-input, multi-output optocoupler, a first output of which forms a linearity controlling feedback path around the low path amplifier and a second output of which forms a second portion of the isolation barrier; and a signal combiner including the transformer that receives the DC to low-frequency portion and the low-frequency to high-frequency portion of the amplified input signal voltage that is coupled across the isolation barrier with the first and second secondary windings co-acting with the primary winding to produce a substantially zero net magnetic flux in the transformer over the DC to high-frequency range of the wideband output signal voltage, the frequency portions being substantially overlapped in a crossover frequency region such that the signal combiner produces the wideband output signal voltage having a substantially flat amplitude response without requiring frequency response adjustments in the crossover frequency region.

14. The apparatus of claim 13 in which the DC to low-frequency portion of the amplified input signal voltage coupled across the isolation barrier has a 3-db rolloff frequency greater than about 100 KiloHertz and the low-frequency to high-frequency portion of the amplified input signal voltage coupled across the isolation barrier has a 3-db rolloff frequency less than about 10 KiloHertz.

15. The apparatus of claim 13 further including a gain adjustment for matching an amplitude response of the low path amplifier to an amplitude response of the high path amplifier.

16. The apparatus of claim 13 in which the isolation barrier has a capacitance of less than about 50 PicoFarads between the first ground and the second ground.

17. The apparatus of claim 13 in which the first ground is elevated at a voltage in a range of about 50 volts to about 3,500 volts relative to the second ground.

18. The apparatus of claim 13 in which the wideband output signal voltage is an accurate representation of the wideband input signal voltage over an input signal frequency range from about zero Hertz to at least about 25 MegaHertz.

19. The apparatus of claim 13 in which the wideband output signal voltage is an accurate representation of the wideband input signal voltage over an input signal frequency range from about zero Hertz to at least about 100 MegaHertz.

20. The apparatus of claim 13 in which the first output of the optocoupler includes a photodiode that is in a negative feedback loop of the low path amplifier to control a stability and an amplitude response of the DC to low-frequency portion of the signal coupled through the optocoupler.

21. The apparatus of claim 13 in which the first secondary winding on the transformer is electrically connected to a first termination resistor, and in which the DC to low-frequency portion of the wideband output signal voltage is developed across the first termination resistor by a first current that is controlled by the optocoupler, and the low-frequency to high-frequency portion of the wideband output signal voltage is developed across the first termination resistor by a voltage that is generated by the first secondary winding of the transformer.

22. The apparatus of claim 21 in which the second secondary winding on the transformer is electrically connected to a second termination resistor, and in which the DC to low-frequency portion of the wideband output signal voltage is further developed across the second termination resistor by a second current that is controlled by the optocoupler, and the low-frequency to high-frequency portion of the wideband output signal voltage is further developed across the second termination resistor by a voltage that is generated by the second secondary winding of the transformer, the first and second termination resistors cooperating to develop a differential wideband output signal voltage.

23. A method for accurately amplifying a wideband input signal voltage referenced to a first ground to provide a wideband output signal voltage referenced to a second ground that is isolated from the first ground by an isolation barrier, comprising:

splitting the wideband input signal voltage into a low path signal having a first 3-db rolloff frequency and a high path signal having a second 3-db rolloff frequency, the first and second rolloff frequencies being substantially overlapped in a crossover frequency region;

coupling the high path signal across the isolation barrier with a transformer having a primary winding and first and second secondary windings;

coupling the low path signal across the isolation barrier with a first output of a single-input, multi-output optocoupler;

closing a feedback loop of an amplifier in the low path with a second output of the optocoupler; and combining the low path signal and high path signal coupled across the isolation barrier via the transformer to generate the wideband output signal voltage having a substantially flat amplitude response without requiring frequency response adjusting steps in the crossover frequency region with the first and second secondary windings co-acting with the primary winding to produce a substantially zero net magnetic flux in the transformer over the DC to high-frequency range of the wideband output signal voltage.

24. The method of claim 23 further including the step of matching an amplitude of the coupled low path signal to an amplitude of the coupled high path signal.

25. The method of claim 23 further including the step of elevating the first ground to a voltage in a range of about 50 volts to about 3,500 volts relative to the second ground.

26. The method of claim 23 in which the combining step further includes:

developing a low path signal portion of the wideband output signal voltage across a termination resistor in response to a current that is controlled by the optocoupler; and developing a high path signal portion of the wideband output signal voltage across the termination resistor in response to a voltage that is generated by the secondary winding of the transformer.

27. In an oscilloscope having a chassis ground, an improved apparatus for accurately displaying an amplitude response versus time of a first input signal that is referenced to a first isolated ground, comprising:

a first isolation barrier that separates the first isolated ground from the chassis ground;

a first split-path isolation amplifier receiving the first input signal and including a high path amplifier employing a transformer having a primary winding and first and second secondary windings to couple a high-frequency portion of the first input signal across the first isolation barrier, and a low path amplifier that employs a single-input, multi-output optocoupler to couple a DC portion of the first input signal across the first isolation barrier;

a first signal combiner including the transformer combining the DC and high-frequency portions of the first input signal coupled across the first isolation barrier to produce a first wideband output signal that is referenced to the chassis ground and that accurately represents the first input signal with the first and second secondary windings co-acting with the primary winding to produce a substantially zero net magnetic flux in the transformer over the DC to high-frequency range of the wideband output signal voltage; and a display subsystem electrically connected to the first wideband output signal for rendering an amplitude response versus time display of the first input signal.

28. The apparatus of claim 27 further including:

a second isolation barrier that separates a second isolated ground from the chassis ground;

a second split-path isolation amplifier receiving a second input signal referenced to the second isolated ground and including a high path amplifier employing a transformer having a primary winding and first and second secondary windings to couple a high-frequency portion of the second input signal across the second isolation barrier, and a low path amplifier that employs an optocoupler to couple a DC portion of the second input signal across the second isolation barrier;

a second signal combiner including the transformer combining the DC and high-frequency portions of the second input signal coupled across the second isolation barrier to produce a second wideband output signal that is referenced to the chassis ground and that accurately represents the second input signal with the first and second secondary windings co-acting with the primary winding to produce a substantially zero net magnetic flux in the transformer over the DC to high-frequency range of the wideband output signal voltage; and the display subsystem electrically connected to the second wideband output signal for rendering an amplitude response versus time display of the second input signal.

29. The apparatus of claim 28 in which the chassis ground, the first isolated ground, and the second isolated ground are mutually isolated from one another by the first and second isolation barriers.

30. The apparatus of claim 27 in which the low path amplifier has a 3-db rolloff frequency greater than about 100

KiloHertz and the high path amplifier has a 3-db rolloff frequency less than about 10 KiloHertz.

31. The apparatus of claim 27 in which the first isolation barrier has a capacitance of less than about 50 PicoFarads between the first isolated ground and the chassis ground.

32. The apparatus of claim 27 in which the first isolated ground is elevated at a voltage in a range of about 50 volts to about 600 volts relative to the chassis ground.

33. The apparatus of claim 27 in which the amplitude response versus time display of the first input signal is an accurate representation of the first input signal over a first input signal frequency range from about zero Hertz to at least about 100 MegaHertz.

* * * * *